(12) United States Patent
Honda et al.

(10) Patent No.: US 8,999,855 B2
(45) Date of Patent: Apr. 7, 2015

(54) MANUFACTURING METHOD OF A SEMICONDUCTOR DEVICE

(71) Applicant: Kabushiki Kaisha Toshiba, Tokyo (JP)

(72) Inventors: Makoto Honda, Kanagawa (JP); Tomonori Aoyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/791,743

(22) Filed: Mar. 8, 2013

(65) Prior Publication Data

US 2013/0252411 A1 Sep. 26, 2013

(30) Foreign Application Priority Data

Mar. 23, 2012 (JP) ................ P2012-067988

(51) Int. Cl.
*H01L 21/461* (2006.01)
*H01L 29/66* (2006.01)
*H01L 21/768* (2006.01)
*H01L 21/02* (2006.01)
*H01L 21/311* (2006.01)
*H01L 21/28* (2006.01)
*H01L 21/285* (2006.01)

(52) U.S. Cl.
CPC ...... *H01L 21/76841* (2013.01); *H01L 21/0206* (2013.01); *H01L 21/02063* (2013.01); *H01L 21/31116* (2013.01); *H01L 21/28052* (2013.01); *H01L 21/28518* (2013.01); *H01L 21/76802* (2013.01); *H01L 21/76814* (2013.01); *H01L 29/665* (2013.01)

(58) Field of Classification Search
USPC ................. 438/300, 649, 651, 655, 660–661, 438/663–664, 728, 738
See application file for complete search history.

(56) References Cited

U.S. PATENT DOCUMENTS

| 5,950,083 | A | * | 9/1999 | Inoue et al. ................... 438/683 |
| 6,638,855 | B1 | | 10/2003 | Chang |
| 2004/0248404 | A1 | | 12/2004 | Subrahmanyan et al. |

FOREIGN PATENT DOCUMENTS

JP 8097294 4/1996

* cited by examiner

*Primary Examiner* — Thanhha Pham
(74) *Attorney, Agent, or Firm* — Patterson & Sheridan LLP (57) ABSTRACT

According one embodiment, a method for manufacturing a semiconductor device is provided, which includes forming a pair of element isolation insulation films on a semiconductor substrate, forming a gate electrode structure on sides of the gate electrode structure, selectively removing oxide films that are formed on a top surface of the diffusion layer and a top surface of the gate electrode by placing the substrate in a gas atmosphere selected from the group consisting of F, Cl, Br, I, H, O, Ar, or N; and irradiating the semiconductor substrate with microwave radiation. The method also includes depositing a metal film on a top surface of the diffusion layer and a top surface of the gate electrode, and a silicide film is formed by heating the substrate.

17 Claims, 7 Drawing Sheets

MANUFACTURING METHOD OF A SEMICONDUCTOR DEVICE

CROSS-REFERENCE TO RELATED APPLICATION

This application is based upon and claims the benefit of priority from Japanese Patent Application No. 2012-067988, filed Mar. 23, 2012, the entire contents of which are incorporated herein by reference.

FIELD

Embodiments described herein relate to the manufacturing method of a semiconductor device.

BACKGROUND

In the process of manufacturing semiconductor devices, when forming a silicide film on a diffusion layer or a gate wiring layer, the natural oxide films, which are generated on the surface of the area where the silicide film will be formed, is removed in advance. To remove such oxide films, various wet etching and dry etching methods are used.

However, when removing such oxide films, portions of other films (for example, oxide insulating films used as the STI (Shallow Trench Isolation), oxide insulating films used as the side wall film of the gate wiring, and so on) are also removed. Removal of the other films can cause failure of the semiconductor devices, such as through current leakage in the device, etc.

Similarly, during etching processes for forming a contact hole, a part of the insulation film forming the side of the contact hole is etched. Additionally, in the cases where an insulating film is formed at the bottom of the contact hole, such as a borderless contact hole, the insulating film at the bottom of the contact hole is etched, which can lead to current leakage.

DETAILED DESCRIPTION

Embodiments of the invention provide a manufacturing method for semiconductor devices having enhanced electrical leak resistance.

In general, the embodiments will be explained with reference to the figures. However, this invention is not limited to these embodiments. In addition, the components that are common throughout all the figures are similarly marked, and repeated descriptions of the same components on different Figures is omitted. Moreover, the figures are schematic diagrams used to illustrate the invention and facilitate the explanation. The shapes, dimensions, ratio, and so on of the figures depicted herein may be different from the actual devices, and the design of these aspects can be modified appropriately in consideration of the following description and the known techniques.

In accordance with the embodiments of this invention, the manufacturing method of semiconductor devices involves forming a pair of element isolation insulation films on a semiconductor substrate which contains silicon. Then, on the top surface of the semiconductor substrate, a gate electrode structure that contains a gate insulating film and silicon is formed that is sandwiched between the pair of element isolation insulating films, and a gate side wall film, which covers the side surface of the gate electrode structure is formed. A diffusion layer on the semiconductor substrate is formed so as to overlie the gate electrode structure; in a gas atmosphere containing any atoms of F, Cl, Br, I, H, O, Ar, or N, the semiconductor substrate is irradiated with microwaves, and the oxide films that are generated on the top surface of the diffusion layer and the top surface of the gate electrode are selectively removed. Then, a metal film is formed on the top surface of the diffusion layer and the top surface of the gate electrode, and a silicide film is formed through heat treatment.

(First Embodiment)

FIGS. 1A-1D are cross sectional views illustrating a manufacturing method of semiconductor devices according to the first embodiment. The following explains the formation method of the silicide film in the manufacturing process of the semiconductor devices, but this invention is not limited to such manufacturing process and such semiconductor devices. Thus, the embodiments of the invention can be used in other processes, and the semiconductor devices described herein can be used in other structures.

Figure 1A:
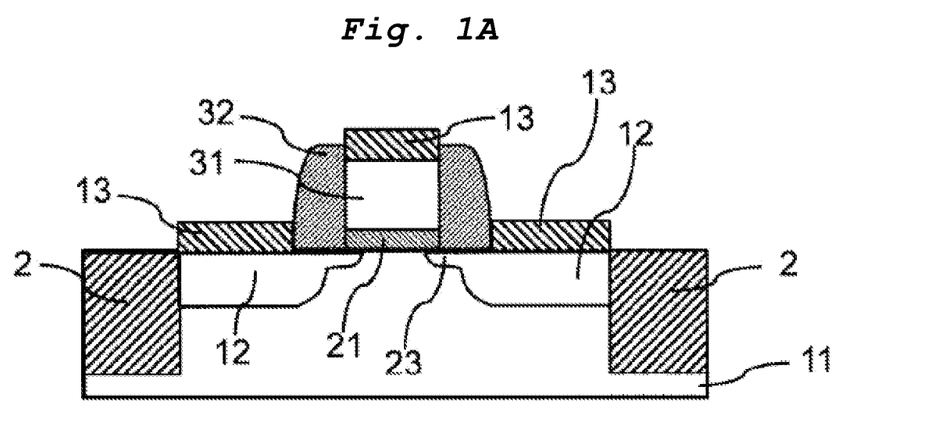
FIGS. 1A to 1D are schematic cross-sectional side views illustrating a manufacturing method of a semiconductor device according to a first embodiment.

First, as shown in FIG. 1A, through the known method, over the region of the substrate within the region of the STI 2, which is formed in a silicon substrate 11, a gate insulating film 21 made from silicon oxide film and a polycrystalline silicon film 31 are formed, and these films are then etched to form a gate electrode as shown in FIG. 1A. The insulation films (element isolation insulation films) made from silicon oxide films are included in STI 2. Thus, a pair of element isolation insulation films, shown as STI 2 (shallow trench isolation), are formed in the silicon substrate 11. P-type or N-type impurities are implanted to form an extension layer 23 in the upper region of substrate 11 which in part underlie the gate electrode. Then, a gate side wall film 32 (spacer) is formed to cover the side walls of the gate insulating film 21 and the polycrystalline silicon film 31. For example, the gate side wall films 32 are made from silicon nitride film, silicon oxide film, laminated films, and so on.

Thereafter, the gate insulating film 21, the polycrystalline silicon film 31 and the gate side wall film 32 are used as a mask, and the P-type or N-type impurities (dopants) are implanted through the extension layer 23, so as to form the diffusion layer 12 which will be the source and drain of the device. As shown in FIG. 1A, on the top surface of the polycrystalline silicon film 31 and the top surface of the diffusion layer 12, there is the oxide film layer 13. This oxide film layer 13 is formed from silicon oxide. Specifically, in the past, the oxide film layer 13, is formed following etching of the sidewall feature and is generated through natural oxidization of the silicon surface of film 31 in an ozone or oxidizing environment to grow the oxide layer. Typically, the thickness of this oxide layer 13 is, for example, less than 10 nm.

Figure 1B:
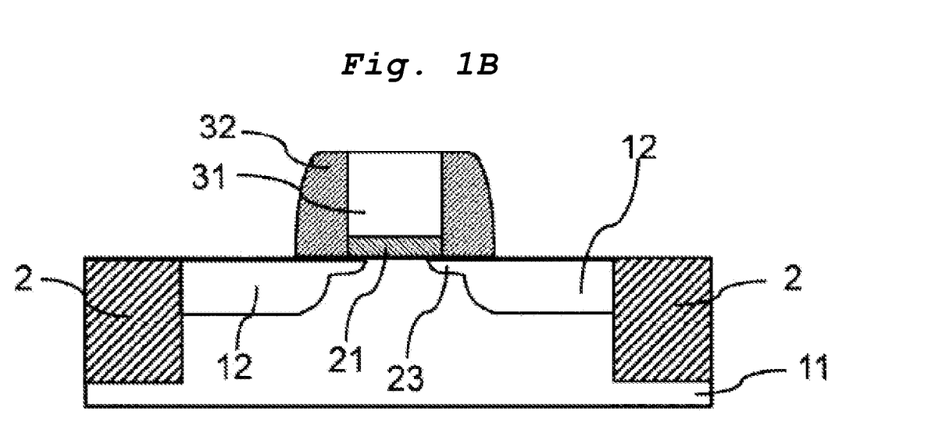

Then, an atmosphere of, for example, $H_2$, HF, or $NF_3/NH_3$, the silicon substrate 11 is excited into a plasma state with microwaves having a frequency of from 2.45 GHz to 25 GHz, typically in a remote location. However, in this embodiment, the silicon substrate 11 is irradiated with the microwaves without exciting the gas atmosphere, and thus the gas is present in a non-plasma state. For the conditions of this microwave irradiation, it is preferred that the temperature of the silicon substrate 11 is set to be less than 600° C., so that the heating induced by microwave irradiation will not cause the characteristic deterioration of each layer on the silicon substrate 11. In addition, the gas in the atmosphere is not limited to the gases previously listed; however, it is preferred that the gas contain at least one element of F, Cl, Br, I, H, O, Ar, and N, which are generally being used in the dry etching. In addition, these gases can also be types of gas used in similar conditions. Moreover, it is preferred that the pressure, flow volume, and so on be adjusted in accordance with the layer conditions of the layer to be removed and the composition of the films that are formed on the silicon substrate 11, and so on. Under such conditions, through irradiating the silicon substrate 11 with the microwaves as shown in FIG. 1B, it is possible to avoid etching of the insulation film and gate side wall film 32 that are contained in STI 2 during selective etching and removal of the oxide film layer 13. Details of the process will be described later.

Figure 1C:
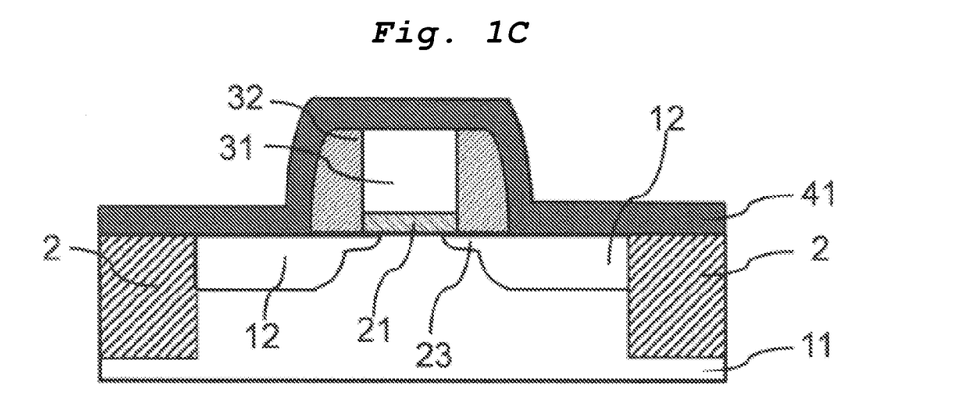

Then, as shown in FIG. 1B, after having selectively removed the oxide film layer 13, a nickel film 41 is deposited to cover the silicon substrate 11, specifically to cover the top surface of STI 2, the top surface of polycrystalline silicon film 31, the surface of the gate side wall film 32 and the top surface of the diffusion layer 12 as shown in FIG. 1C. The nickel film 41 is deposited without exposing the silicon substrate 11 to the atmosphere after the microwave irradiation i.e., it is maintained in an environment where it is not exposed to air. Here, an example is based on the deposition of a nickel film 41; however, this embodiment is not limited to nickel film, as it is possible to use the film that can react with silicon and form a silicide film. For example, it is possible to use a metal that contains any one of the following substances: Ni, Co, Pt, Ta, W, Ti, Pd, Rh, Ir, Nb, Zr, Hf, and Mo to form the film.

Figure 1D:
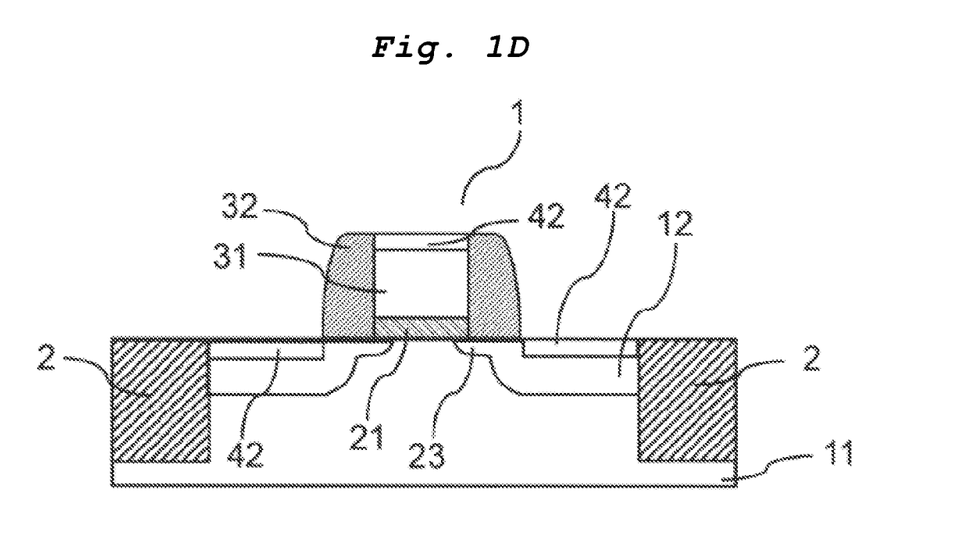

Then, through the heat treatment of the silicon substrate 11, the silicon that is contained in the polycrystalline silicon film 31 and the diffusion layer 12 reacts with the nickel film 41, and a nickel silicide film 42 is formed on the top surface of the polycrystalline silicon film 31 and the top surface of the diffusion layer 12. Then, the non-reacted nickel film 41 is removed by wet etching, and the semiconductor device 1 as shown in FIG. 1D can be obtained.

In accordance with this embodiment, in a gas atmosphere containing F, Cl, Br, I, H, O, Ar, and/or N, and by irradiating the silicon substrate 11 with the microwaves, it is possible to avoid etching of the insulation film of the STI and the gate side wall films 32. It is also possible to selectively etch the oxide film layer 13 that is a by-product of etching, the natural oxide film and so on. It is also possible to remove the oxide film layer 13 without damage to adjacent layers. In other words, when removing the oxide film layer 13, it is possible to avoid exposing the silicon substrate 11 and polycrystalline silicon film 31 from the insulation film and gate side wall films 32 that are contained in the STI 2, because the etching of the insulation film and the gate side wall film 32 that are contained in the STI 2 can be suppressed.

Therefore, in the exposed area of the insulation film and gate side wall film 32 that are contained in STI 2, it is possible to avoid the reaction between the silicon and the nickel film 41, which may generate the nickel silicide film in local areas.

Thus, because this embodiment makes it difficult to form a current leak path from the nickel silicide film, which is generated in local areas, it is possible to form the semiconductor device 1 having superior electrical leak resistance.

To be specific, in this embodiment, it is possible to avoid etching the insulation film and gate side wall film 32 that are contained in STI 2, to selectively etch the oxide film layer 13, and then to remove the oxide film layer 13. The reasons for this are explained below.

The microwave wavelength that is irradiated on the silicon substrate 11 is longer than the wavelengths of ultraviolet light, visible light, infrared light, and so on, which has the effect of high permeability to the inside of the films. Moreover, because the absorption rate of the microwave may vary depending on the composition of the film, as compared with the insulation film and gate side wall film 32 that are contained in STI 2, temperature increases of the silicon substrate 11 and polycrystalline silicon film 31 are easily achieved by irradiation using microwaves. Therefore, as the temperature of the polycrystalline silicon film 31 and the silicon substrate 11 is increased, the temperature of the thin oxide film layer 13, that is located thereon, is also increased to be greater than the temperature of the insulation film and gate side wall film 32 that are contained in STI 2.

Furthermore, in the case of dry etching under such a state, the oxide film layer 13, that has a greater temperature, is etched. Conversely, the lower temperature of the insulation film and gate side wall film 32 that are contained in STI 2 makes it difficult to etch the insulation film and gate side wall film 32 that are contained in STI 2. To be more specific, when the temperature is high, because it is easy to volatilize the materials that are generated through etching, it is easy to etch the exposed surface after volatilization. On the other hand, when the temperature is low, because it is difficult to volatilize the material formed by the etchant(s), the etching deposits that are left on the surface will obstruct the etching, thereby making it more difficult to etch. Thus, in this embodiment, it is possible to avoid etching the insulation film and gate side wall film 32 that are contained in STI 2, to thereby selectively etch the oxide film layer 13, and then to remove the oxide film layer 13.

Therefore, this embodiment is not limited to the previously described film, and the combination of other films that have such characteristics can also be applicable to this embodiment. In addition, the film to be selectively etched is not limited to, for example, a layer that is formed from etching residues produced in a previous process, or the oxide film layer 13 that is formed from oxidation in an oxidizing atmosphere in a previous process. The film to be selectively etched can also be an insulating film, such as an oxide film, a nitride film, an organic coated film, a polymer film, and so on.

Moreover, in accordance with this embodiment, it is not necessary to significantly change the manufacturing process of semiconductor devices that had been used conventionally. One can use microwave irradiation in the presence of a gas that is used in a general dry etching process, making it is possible to etch the oxide film layer 13 selectively and then remove it.

(Second Embodiment)

A method of manufacturing a contact plug 3 of the semiconductor devices according to this embodiment is described with reference to FIG. 2A, FIG. 2B and FIG. 2C. However, this invention is not limited to the contact plug 3 of the semiconductor devices in the form as described below, as it can also be used in other forms to manufacture other semiconductor devices.

Figure 2A:
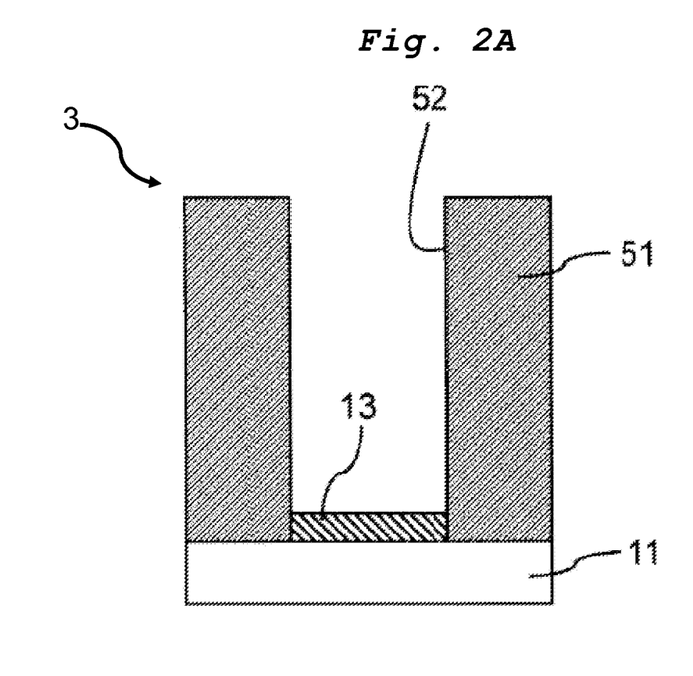
FIGS. 2A to 2C are schematic cross-sectional side views illustrating a manufacturing method of the semiconductor device according to a second embodiment.
Figure 2B:
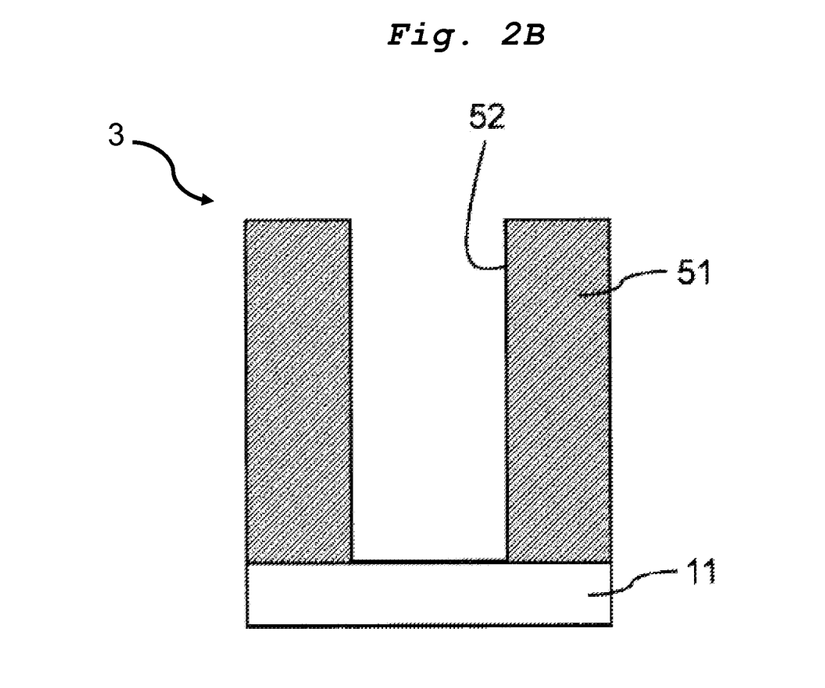

As shown in FIG. 2A, on a silicon substrate 11, for example, an insulating film 51 that is made of silicon oxide film is provided to form a mask. An RIE (Reactive Ion Etching) method is used to form a contact hole 52. At that time, as in the first embodiment, an oxide film layer 13 is formed on the silicon substrate 11 at the bottom of the contact hole 52. This oxide film layer 13 can be for example, a layer that is formed from etching residue performed in a previous process, or from the oxidation in an oxidizing atmosphere performed in a previous process. The thickness of this oxide film layer 13 can be, for example, less than 10 nm.

Then, after removing the mask (not shown in the figure), as in the first embodiment, the silicon substrate 11 is irradiated with the microwaves from 2.45 GHz to 25 GHz, in an atmosphere of, for example, $H_2$, HF, or $NF_3/NH_3$. In addition, in this embodiment, the silicon substrate 11 is irradiated with the microwaves without exciting the gas atmosphere to make the gas into a plasma. For the conditions of this microwave irradiation, the temperature of the silicon substrate 11 is set to less than 600° C., so that the heating will not cause characteristic deterioration of each layer on the silicon substrate 11. In the case of using the nickel silicide film to replace the silicon substrate 11, the temperature of the silicon substrate 11 is set to less than 400° C. Moreover, the gas in the atmosphere is not limited to the previously described gases; however, the gas may contain at least one element of F, Cl, Br, I, H, O, Ar, and N, which are generally being used in the dry etching process. Further, the pressure, flow rate, etc. are adjusted in accordance with the shape and composition of the silicon substrate 11. As shown in FIG. 2B, under such conditions, through irradiating the silicon substrate 11 with the microwaves, as in the first embodiment, it is possible to avoid etching the insulation film 51, to selectively etch the oxide film layer 13, and then to remove the oxide film layer 13. As previously explained, in this embodiment, because the absorption rate of the microwave may vary depending on the composition of the films, as compared with the insulation film 51, increasing the temperature of the silicon substrate 11 is easier to obtain, as compared with the insulation film 51. Therefore, because the temperature of the oxide film layer 13 on the silicon substrate 11 is easily increased, as compared with the temperature of the insulating film 51, it is possible to avoid the etching of the insulating film 51, to selectively etch the oxide film layer 13, and then to remove the oxide film layer 13.

Then, after the oxide film layer 13 is removed, a laminated layer of Ti/TiN as a contact barrier metal layer 61 is deposited, and a tungsten film 62 is further deposited. A CMP (Chemical Mechanical Polishing) method is used to remove the contact barrier metal 62 and the tungsten film 61 that are projecting from the contact hole 52 and forms the contact plug 3 as shown in FIG. 3C.

In accordance with this embodiment, in a gas atmosphere containing any element of F, Cl, Br, I, H, O, Ar, and N, and irradiating the silicon substrate 11 with the microwaves, it is possible to avoid etching the insulation film 51, to selectively etch the oxide film layer 13, and then to remove it. In other words, when removing the oxide film layer 13, because the etching of insulation film 51 that forms the side wall of the contact hole 52 can be suppressed, it will not increase the diameter of the contact hole 52. Therefore, it is possible to form the contact plug 3 with a contact hole 52 having a desired diameter. Moreover, because the etching of insulation film 51 that forms the side wall of the contact hole 52 can be suppressed, the tungsten film 62 will not be able to enter the parts where no contact barrier metal layer 61 exists. As a result, no leak path will form, and it is possible to form the contact plug 3 having superior electrical leak resistance.

In addition, when irradiating with microwaves, due to the difference of the dielectric constant of the film, the content of the contained moisture, the content of the impurities and dipole, it is possible to cause a difference in temperature between the layers. Therefore, this embodiment is not limited to the previously described film, as combinations of other films that have such characteristics can be also applicable to this embodiment. In addition, the film to be selectively removed is not limited to, for example, the layer that is formed from etching residue in a previous process, from a damaged layer produced in a previous process, or from the oxide film layer 13 that is formed in an oxidizing atmosphere in a previous process. The film to be selectively removed can also be an insulating film such as an oxide film, a nitride film, an organic coated film, a polymer film, and so on.

Moreover, in accordance with this embodiment, it is not necessary to significantly change the manufacturing process of the semiconductor devices that had been used conventionally. One can use microwave irradiation in the presence of a gas that is used in a general dry etching process, making it is possible to etch the oxide film layer 13 selectively and then remove it.

(Third Embodiment)

For this embodiment, the difference from the second embodiment is that an etch stop film 71 is formed in advance at the bottom of the contact hole 52, and then this etch stop film 71 is etched and removed. The manufacturing method of the contact plug 3 of the semiconductor device in this embodiment is described with reference to FIGS. 3A and 3B. This invention, however, is not limited to the contact plug 3 of the semiconductor devices in the form as described below, as it can also be used in other forms to manufacture the semiconductor devices. In addition, in the following description of the embodiment of this invention, for the components that have the same structure and functions as those described in the first embodiment and the second embodiment, the same reference numerals as used in the first embodiment and the second embodiment have been used, and their descriptions will not be repeated for brevity.

Figure 3A:
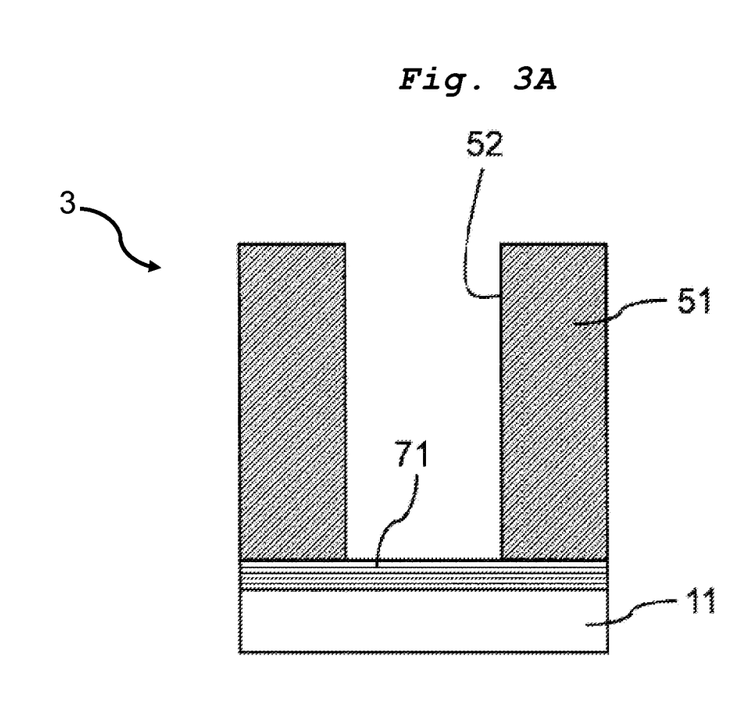
FIGS. 3A and 3B are schematic cross-sectional side views illustrating a manufacturing method of the semiconductor devices according to a third embodiment.

As shown in FIG. 3A, on the silicon substrate 11, for example, the etch stop film 71 and the insulating film 51 are set so as to form a mask. In addition, the RIE method is used to etch the insulating film 51 and form the contact hole 52. The etch stop film 71 is formed from a nitride film or an oxide film of SiN, $SiO_2$ and so on and the thickness of the film can be, for example, 20 nm.

Figure 3B:
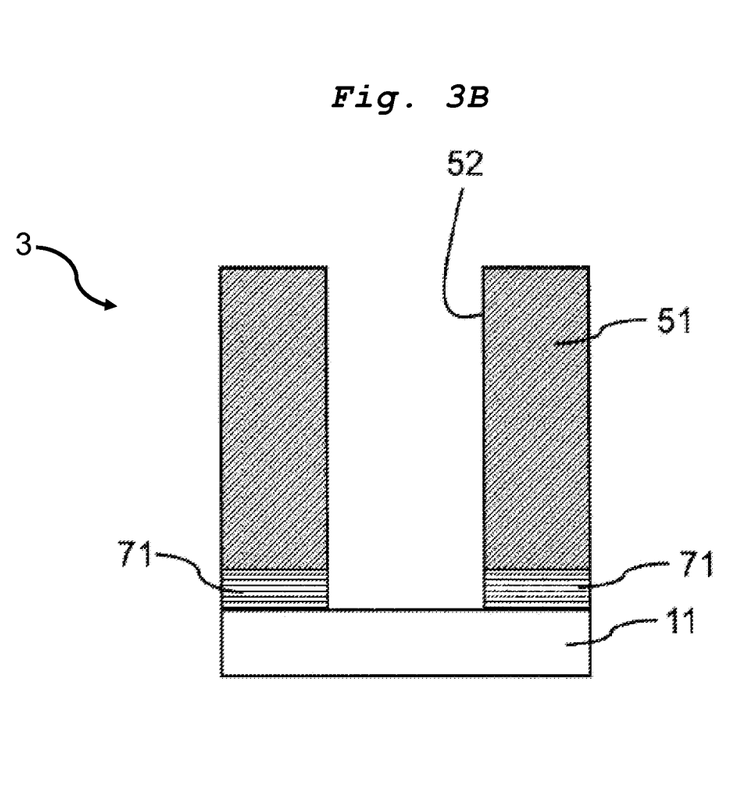

Then, after removing the mask, as in the second embodiment, an atmosphere of, for example, $H_2$, HF, or $NF_3/NH_3$, the silicon substrate 11 is irradiated with the microwaves from 2.45 GHz to 25 GHz. In addition, in this embodiment, the silicon substrate 11 is irradiated with the microwaves without exciting the gas to a state that would make the gas into a plasma. For the conditions of this microwave irradiation, the substrate temperature of the silicon substrate 11 be set to less than 600° C., so that the heat will not cause the characteristic deterioration of each layer on the silicon substrate 11. In the case of using the nickel silicide film to replace the silicon substrate 11, the temperature may be set to less than 400° C. Moreover, the gas in the atmosphere is not limited to the previously described substances; however, the gas contains at least one element of F, Cl, Br, I, H, O, Ar, and N, which are generally being used in the dry etching process. Further, the pressure, flow rate, etc. are adjusted in accordance with the shape and composition of the silicon substrate 11. As shown in FIG. 3B, under such conditions, through irradiating the silicon substrate 11 with the microwaves, as in the second embodiment, it is possible to avoid etching the insulation film 51, to selectively etch the etch stop film 71, and then to remove the etch stop film 71. That is to say, as previously explained, in this embodiment, because the absorption rate of the microwave may vary depending on the composition of the film, as compared with the insulation film 51, the temperature of the silicon substrate 11 is easier to increase. Therefore, because the temperature of the etch stop film 71 on the silicon substrate 11 is also easier to increase, as compared to increasing the temperature of the insulating film 51, it is possible to avoid the etching of the insulating film 51, to selectively etch the etch stop film 71, and then to remove the etch stop film 71. Moreover, in the case when a natural oxide film is formed under the etch stop film 71, it may be removed along with the etch stop film 71.

Figure 2C:
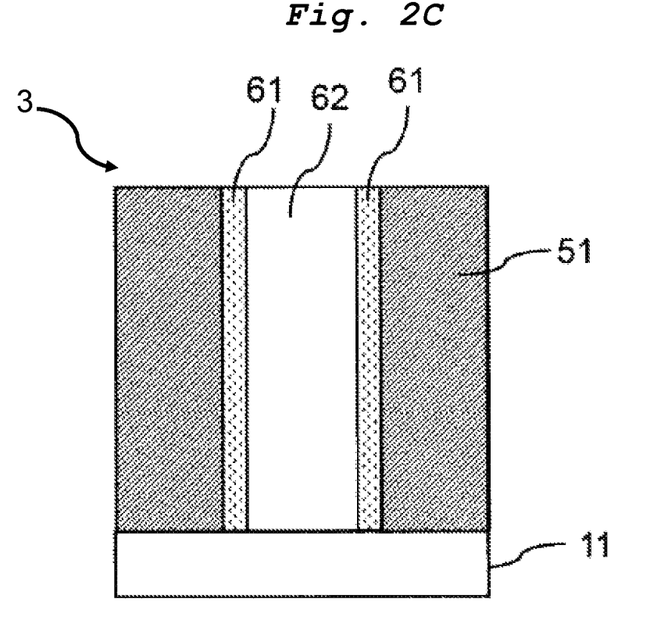

Because the subsequent process involves depositing the contact barrier metal layer 61 and the tungsten film 62, then the contact barrier metal layer 61 and the tungsten film 62, which are protruding from the contact hole 52, are removed; this process is same as the process of the second embodiment that is shown in FIG. 2C, and, therefore, the duplicative descriptions have been omitted.

In accordance with this embodiment, in a gas atmosphere containing any element of F, Cl, Br, I, H, O, Ar, and N, and irradiating the silicon substrate 11 with microwaves, it is possible to avoid etching the insulation film 51, to selectively etch the etch stop film 71, and then to remove it. In other words, when removing the etch stop film 71, because the etching of insulation film 51 that forms the side wall of the contact hole 52 can be suppressed, it will not increase the diameter of the contact hole 52. Therefore, it is possible to form the contact plug 3 with contact hole 52 having a desired diameter. Moreover, because the etching of insulation film 51, which forms the side wall of the contact hole 52, can be suppressed, the tungsten film 62 will not be able to enter the parts where no contact barrier metal layer exists. As a result, no leak path will form, and it is possible to form the contact plug 3 having superior electrical leak resistance.

In addition, when irradiating with microwaves, due to the difference of the dielectric constant of film, the content of the contained moisture, and the content of the impurities and dipole, it is possible to cause the difference in temperature between the films. Therefore, this embodiment is not limited to the previously described film, as combinations of other films that have such characteristics can be also applicable to this embodiment. In addition, the film to be selectively removed is not limited to, for example, the etch stop film 71 that is formed from an oxide film or a nitride film. The film to be selectively removed can also be an insulating film, such as an organic coated film, a polymer film, and so on.

Moreover, in accordance with this embodiment, it is not necessary to significantly change the manufacturing process of the semiconductor devices that had been used conventionally. One can use microwave irradiation in the presence of a gas that is used in a general dry etching process making it is possible to etch the etch stop film 71 selectively and then remove it.

Furthermore, in the first embodiment to the third embodiment, the substrate does not necessarily have to be a silicon substrate, as other substrates (for example, SOI (Silicon on insulator) substrate and SiGe substrate) can also be used. Moreover, these embodiments can also be realized with a semiconductor structure that is formed on various substrates.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device, comprising:
    forming a pair of element isolation insulation films on a silicon-containing semiconductor substrate;
    forming a gate electrode structure on a surface of the silicon-containing semiconductor substrate, between the pair of element isolation insulating films;
    forming a diffusion layer on sides of the gate electrode structure;
    selectively removing oxide films that are formed on a top surface of the diffusion layer and a top surface of the gate electrode structure by heating the silicon-containing semiconductor substrate and the oxide films to a temperature greater than a temperature of the element isolation films, wherein the heating comprises irradiating the silicon-containing semiconductor substrate with microwave radiation without exciting a gas atmosphere surrounding the silicon-containing semiconductor substrate into a plasma; and
    depositing a metal film on a top surface of the diffusion layer and a top surface of the gate electrode structure.

2. The manufacturing method of claim 1, wherein heating the silicon-containing semiconductor substrate further comprises:
    placing the silicon-containing semiconductor substrate in a gas atmosphere including atoms selected from the group consisting of F, Cl, Br, I, H, O, Ar, or N.

3. The manufacturing method of claim 2, wherein the microwave radiation has a frequency of 2.45 GHz to 25 GHz.

4. The manufacturing method of claim 3, wherein an energy of the microwave radiation is less than an ionization energy of the gas atmosphere.

5. The manufacturing method of claim 2, wherein the metal film is selected from the group consisting of Ni, Co, Pt, Ta, W, Ti, Pd, Rh, Ir, Nb, Zr, Hf, and Mo.

6. The manufacturing method of claim 5, further comprising:
    heating the silicon-containing semiconductor substrate to form a silicide film on the top surface of the diffusion layer and the top surface of the gate electrode structure.

7. The manufacturing method of claim 2, further comprising:
    heating the silicon-containing semiconductor substrate to form a silicide film on the top surface of the diffusion layer and the top surface of the gate electrode structure, the silicide film including a metal selected from the group consisting of Ni, Co, Pt, Ta, W, Ti, Pd, Rh, Ir, Nb, Zr, Hf, and Mo.

8. A manufacturing method of a semiconductor device, comprising:
    forming a pair of element isolation insulation films on a silicon-containing semiconductor substrate;
    forming a gate electrode structure on a surface of the silicon-containing semiconductor substrate, between the pair of element isolation insulating films;
    forming a diffusion layer on sides of the gate electrode structure;
    selectively removing oxide films that are formed on a top surface of the diffusion layer and a top surface of the gate electrode structure by placing the silicon-containing semiconductor substrate in a gas atmosphere selected from the group consisting of F, Cl, Br, I, H, O, Ar, or N, and irradiating the silicon-containing semiconductor substrate with microwave radiation without exciting the gas atmosphere surrounding the silicon-containing semiconductor substrate into a plasma; and depositing a metal film on the top surface of the diffusion layer and the top surface of the gate electrode structure.

9. The manufacturing method of claim 8, further comprising:

heating the silicon-containing semiconductor substrate to form a silicide film on the top surface of the diffusion layer and the top surface of the gate electrode structure.

10. The manufacturing method of claim 9, wherein the gate electrode structure comprises a gate insulating film, and a gate side wall film.

11. The manufacturing method of claim 10, wherein the metal film is selected from the group consisting of Ni, Co, Pt, Ta, W, Ti, Pd, Rh, Ir, Nb, Zr, Hf, and Mo.

12. The manufacturing method of claim 11, wherein the microwave radiation has a frequency of 2.45 GHz to 25 GHz.

13. The manufacturing method of claim 8, wherein the metal film is selected from the group consisting of Ni, Co, Pt, Ta, W, Ti, Pd, Rh, Ir, Nb, Zr, Hf, and Mo.

14. The manufacturing method of claim 13, further comprising:

heating the silicon-containing semiconductor substrate to form a silicide film on the top surface of the diffusion layer and the top surface of the gate electrode structure.

15. The manufacturing method of claim 8, further comprising:

heating the silicon-containing semiconductor substrate to form a silicide film on the top surface of the diffusion layer and the top surface of the gate electrode structure, the silicide film including a metal selected from the group consisting of Ni, Co, Pt, Ta, W, Ti, Pd, Rh, Ir, Nb, Zr, Hf, and Mo.

16. The manufacturing method of claim 8, wherein the microwave radiation has a frequency of 2.45 GHz to 25 GHz.

17. The manufacturing method of claim 16, wherein an energy of the microwave radiation is less than an ionization energy of the gas atmosphere.

* * * * *